United States Patent [19]
Paoli et al.

[11] Patent Number: 5,136,604
[45] Date of Patent: Aug. 4, 1992

[54] APPARATUS AND METHOD FOR DETECTING THE POWER LEVEL IN SINGLE AND MULTI-STRIPE INTEGRATED LASERS

[75] Inventors: Thomas L. Paoli, Los Altos; G. A. Neville Connell, Cupertino; Doald R. Scifres, Los Altos Hills; Robert L. Thornton, East Palo Alto, all of Calif.

[73] Assignee: Xerox Corporation, Rochester, N.Y.

[21] Appl. No.: 500,814

[22] Filed: Mar. 28, 1990

[51] Int. Cl.[5] .................................... H01S 3/19
[52] U.S. Cl. ................................ 372/50; 372/45; 372/46
[58] Field of Search ........................ 372/50, 45, 46

[56] References Cited

U.S. PATENT DOCUMENTS

| | | | |
|---|---|---|---|
| 4,633,476 | 12/1986 | Scifres et al. | 372/45 |
| 4,653,058 | 3/1987 | Akiba et al. | 372/50 |
| 4,674,100 | 6/1987 | Kobayashi | 372/96 |
| 4,692,207 | 9/1987 | Bouadma et al. | 156/649 |
| 4,802,182 | 1/1989 | Thornton et al. | 372/50 |
| 4,947,400 | 8/1990 | Dutta | 372/50 |

Primary Examiner—James W. Davie
Attorney, Agent, or Firm—Townsend and Townsend

[57] ABSTRACT

The present invention is an apparatus and method for providing detection of a laser output on a semiconductor wafer. A laser cavity and a detection cavity are formed on a semiconductor wafer in parallel such that light emitted laterally from the laser cavity is detected by the detection cavity. The amount of light detected can then be transformed into data, which in turn can be used to control the output of the laser.

50 Claims, 8 Drawing Sheets

APPARATUS AND METHOD FOR DETECTING THE POWER LEVEL IN SINGLE AND MULTI-STRIPE INTEGRATED LASERS

BACKGROUND OF THE INVENTION

The present invention relates generally to lasers. More particularly, the invention relates to semiconductor detectors for detecting the level of power output by semiconductor lasers.

One technique used to detect the power of a laser is an in-line external detector which interrupts light that emanates directly from the front or back facet of the laser. In the case of an independently addressable laser array, this in-line detector monitors the light emanating from the facets of all of the lasers in the array. The result of such a detection technique is that independent power control of each laser element is not possible. Therefore complicated methods involving the use of imaging optics to split light off from the forward or backward laser beam have been resorted to. However, the result is a cumbersome, inelegant, and delicate package that is not suitable for use in more integrated situations. Other disadvantages of in-line detection techniques exist. For example, the operation of the laser is directly interfered with as part of the beam must be channelled into the detector. This translates into reduced output efficiency.

In addition to in-line detection techniques, there have also been detectors implemented with reflectors to emit light from the laser in a direction vertical to the horizontal active layer of a semiconductor laser. For example, Scifres, et al., U.S. Pat. No. 4,633,476, discloses internal mirrors placed in the light path of the laser causing light to be reflected upwards and out of the semiconductor substrate. The light is then detected at the surface of the semiconductor device where it can be used to provide data regarding the power level of the laser.

Kobayashi, U.S. Pat. No. 4,674,100 is similar to Scifres in that it includes a detector which receives light diffracted from within the laser and then uses the level of this light to determine the power of the laser; However, like Scifres, Kobayashi provides the detector in a different level of the semiconductor material than that of the laser. Therefore, the laser and the detector have differing layer designs and also must be fabricated at different times.

SUMMARY OF THE INVENTION

The present invention is an apparatus and method for detecting single and multi-striped laser outputs. A light detector is integrated in the same semiconductor layer as the laser itself. Light leaking laterally from the laser cavity is detected by the detector. The data collected by the detector can then be used to monitor the output of the laser. Since the photon energy of the laser light is always slightly larger than the band gap of the material in the active region of the laser, and the active region of the detector is back biased, the laser and the detector can have identical layer design. This permits the laser and the detector to be formed simultaneously in a semiconductor device. A typical technique used in fabricating the semiconductor to contain both a laser and a detector is impurity induced disordering. This technique is described in Thornton, U.S. Pat. No. 4,802,182.

A further aspect of the present invention is its use in a semiconductor substrate containing multiple lasers. Each laser is provided with a separate detector. This is possible because the detector element is small enough to be included with each laser element in an independently adjustable array. This allows independent control of each laser by a feedback loop connected to its corresponding detector.

The advantages achieved by the use of the present invention are numerous. First, the laser and the detector can be formed simultaneously on the same semiconductor substrate. This is because the detector and the laser are formed in the same layer with identical layer design. A second advantage achieved by the present invention is that the design of the detector has a minimal effect on the performance of the laser itself. Since there is no need for the detector to be placed in line where it can obstruct the ultimate path of the light, the detector does not interfere with the beam being provided by the laser. Third, there is no need to implement imaging optics required in other laser detectors which may be cumbersome, inelegant and delicate and which may not be suitable for use in integrated circuits. Finally, the present invention can be used in a semiconductor device containing multiple lasers wherein each laser is provided with a separate detector.

For a more complete understanding of the nature of the invention, reference should be made to the ensuing detailed description taken in conjunction with the accompanying drawings.

DETAILED DESCRIPTION OF THE DRAWINGS

Figure 1:
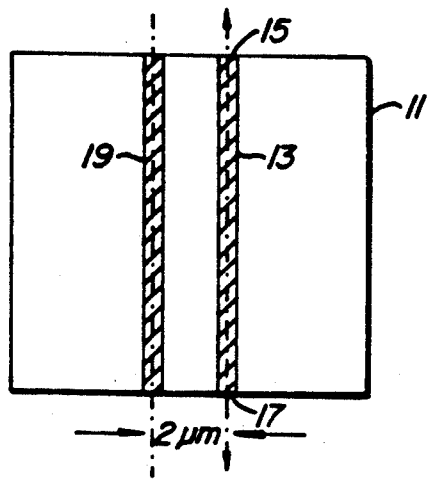
FIG. 1 is a diagram showing a top-down view of a laser and a detector on the semiconductor substrate.

FIG. 1 is a diagram of a semiconductor substrate 11 having a layer containing a laser cavity 13 with a front facet 15 and a back facet 17 through which light is emitted. In the same layer on semiconductor 11, and running parallel to laser cavity 13, is a detector cavity 19. Laser cavity 13 and detector cavity 19 are active regions in the structure on semiconductor substrate 11. These cavities are typically formed on semiconductor substrate 11 through the use of a technique known as impurity induced disordering described in Thornton herein incorporated by reference. Laser cavity 13 is then forward biased until laser operation occurs and detector cavity 19 is reverse biased to act as a light detector.

In operation, most of the light flowing through laser cavity 13 emanates from front facet 15 and rear facet 17 of laser 13. However, a small amount of evanescent light from laser cavity 13 enters detector cavity 19. Therefore, detector 19 can be used to detect and with external circuitry (not shown) control the output power of laser cavity 13.

Laser cavity 13 and detector cavity 19 are parallel regions on semiconductor substrate 11. These regions should be placed at a distance which depends on the modal function created in laser cavity 13. Another factor which must be considered in determining the distance between laser cavity 13 and detector cavity 19 is the length of detector cavity 19. This factor is important because the longer the length of detector cavity 19, the more light absorbed from laser cavity 13. Therefore, if detector cavity 19 is lengthened, the amount of light emanating from laser cavity 13 through front facet 15 and rear facet 17 is reduced for the same current. This effect can be limited by moving detector cavity 19 to a greater distance away from laser cavity 13. Typically, detector cavity 19 should be placed at a point such that a one percent light detection is achieved. In practice, a preferred distance between laser cavity 13 and detector cavity 19 has been found to be between one and two micrometers.

Figure 2:
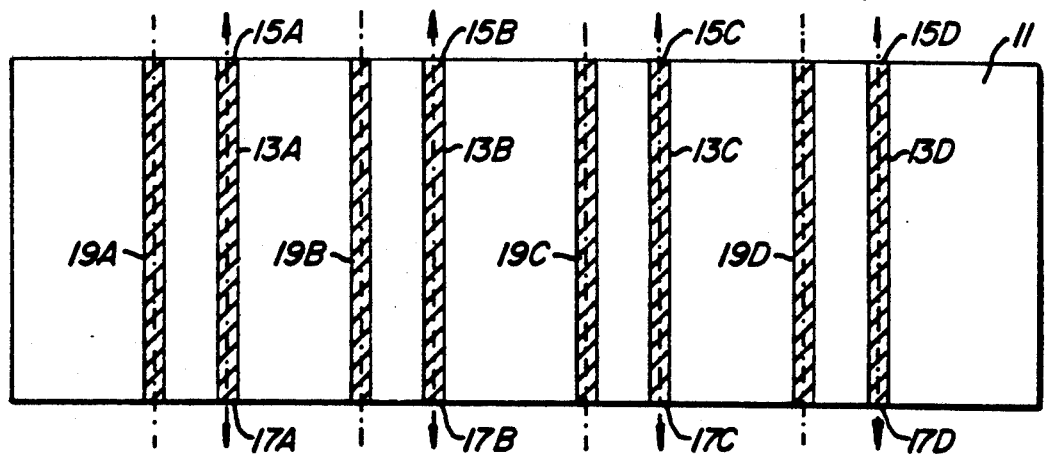
FIG. 2 is a diagram showing a top-down view of multiple lasers with corresponding detectors on a single semiconductor substrate.

FIG. 2 is a diagram showing semiconductor substrate 11 containing multiple laser cavities 13A-13D, along with corresponding detector cavities 19A-19D. Each laser cavity/detector cavity pair works similarly to the laser cavity/detector cavity pair shown in FIG. 1.

Figure 3:
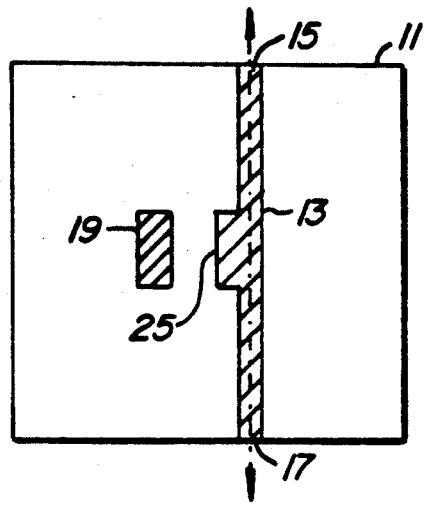
FIG. 3 is a diagram showing a top-down view of a laser and its corresponding detector on a semiconductor substrate, wherein the laser contains a squared protrusion and the detector is limited in length to the length of the protrusion.
Figure 4:
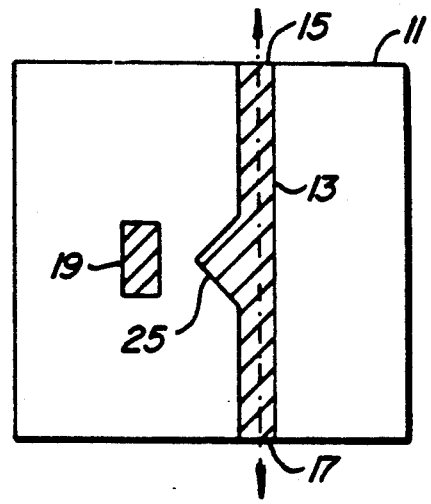
FIG. 4 is a laser and its corresponding detector similar to that of FIG. 3, wherein the protrusion is triangular.
Figure 5:
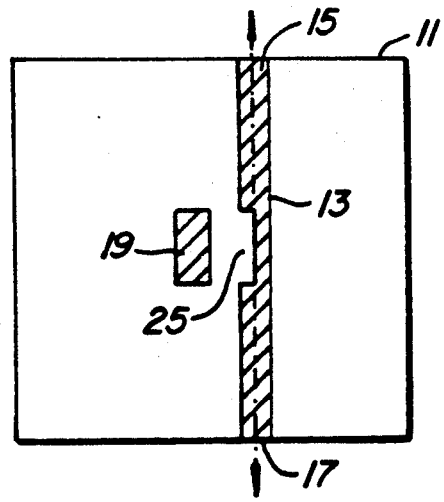
FIG. 5 is a diagram showing a top-down view of a laser and its corresponding detector wherein the laser contains a square indentation.
Figure 6:
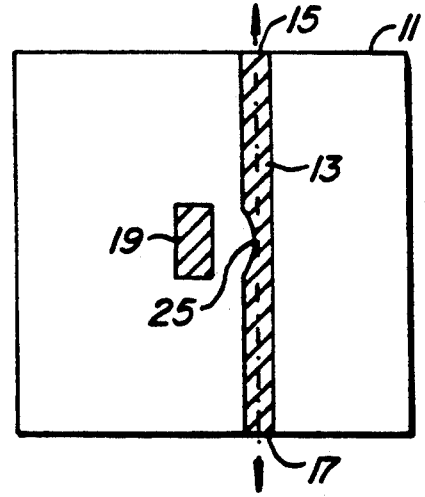
FIG. 6 is a diagram showing a top-down view of a laser and its corresponding detector wherein the laser contains a rounded indentation.
Figure 7:
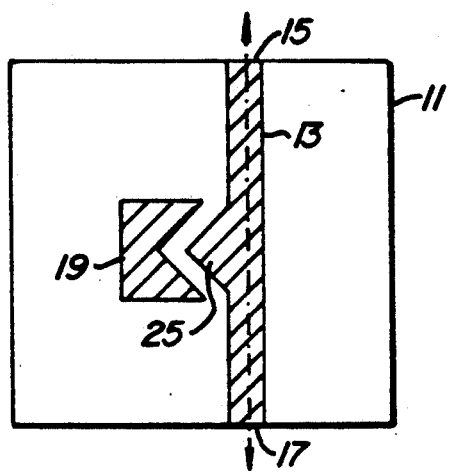
FIG. 7 is a diagram showing a top-down view of a laser and its corresponding detector on a semiconductor substrate wherein the laser contains a triangular protrusion and the detector contains a corresponding triangular indentation.
Figure 8:
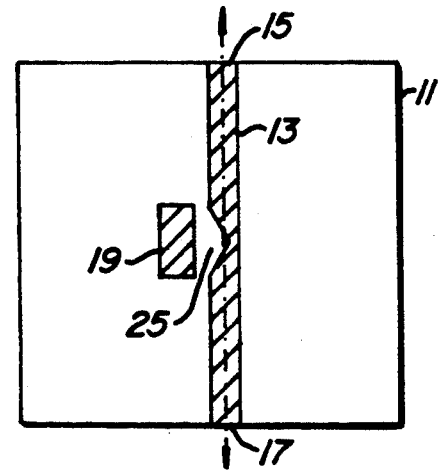
FIG. 8 is a diagram showing a top-down view of a laser and its corresponding detector on a semiconductor substrate wherein the laser contains a triangular indentation.

FIG. 3 is a diagram showing semiconductor substrate 11 having laser cavity 13 and detector 19 formed thereon. Laser cavity 13 has a front facet 15 and a back facet 17 through which light is emitted. Laser cavity 13 contains a protrusion 25 extending horizontally from laser cavity 13 in a rectangular shape. Detector cavity 19 is also rectangular in shape. As light moves through laser cavity 13, and enters protrusion 25, its modal field is altered and scattered such that detection is made more apparent in detector cavity 19. As the light continues through laser cavity 13 and beyond protrusion 25, the shape of the modal field of the light is reformed to its original shape.

Figure 11B:
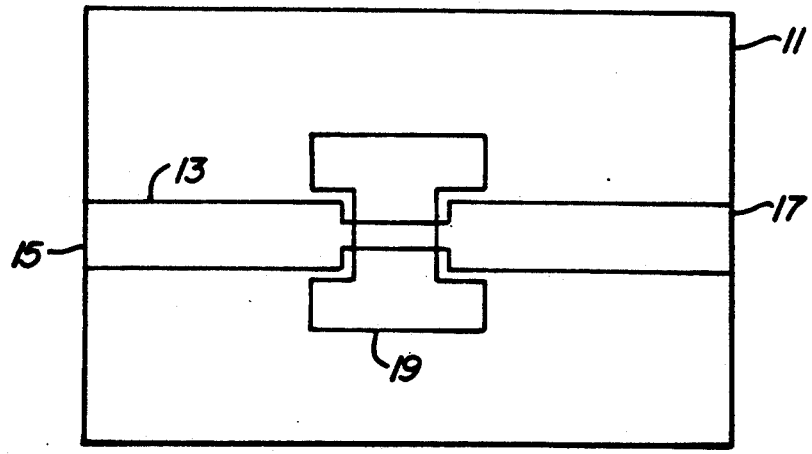
FIG. 11B illustrates an embodiment in which the detector symmetrically surrounds the narrowed waveguide.

FIGS. 4–8, 9A, 9B, 9C, 10, 11A, 11B, 12A, 12B and 12C each show semiconductor substrate 11 having laser cavity 13 and detector cavity 19 formed thereon. In each of these figures, laser cavity 13 contains an alternatively shaped perturbation 25, which takes the form of a protrusion, an indentation or a narrowing in laser cavity 13. Further, detector cavity 19 takes on alternative shapes depending upon the shape of perturbation 25. In each figure, the modal field of the light transmitted through laser cavity 13 is altered by the perturbation and detected by detector cavity 19. The various shapes of perturbation 25 create different changes in the modal field and allow for different interaction between laser cavity 13 and detector cavity 19. In FIG. 12A, as in FIG. 2, a multiplicity of laser cavities 13A-D and corresponding detector cavities 19A-D are shown.

Figure 9A:
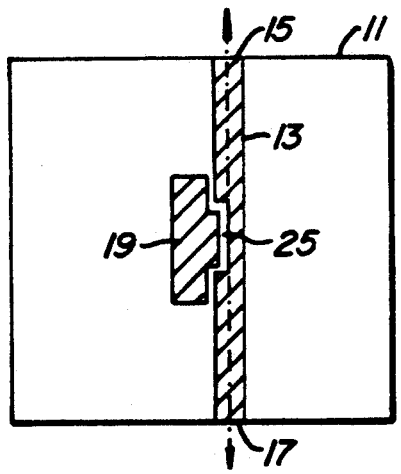
FIG. 9A is a diagram showing a top-down view of a laser and its corresponding detector wherein the laser contains a square indentation and the corresponding detector contains a square protrusion which fits within the square indentation of the laser.
Figure 10:
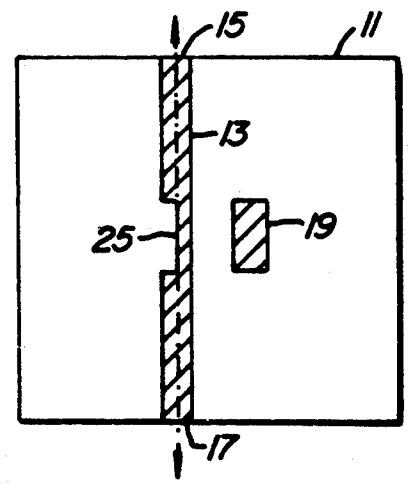
FIG. 10 is a diagram showing a top-down view of a laser and its corresponding detector on a semiconductor substrate wherein the laser contains a square indentation on the side opposite the corresponding detector.
Figure 9B:
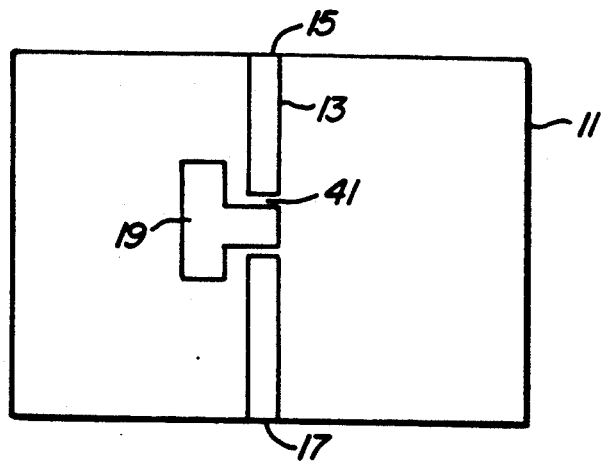
FIG. 9B is a diagram showing a top-down view of a laser and its corresponding detector wherein the laser contains a gap and the corresponding detector contains a square protrusion which fits within the gap of the laser.
Figure 9C:
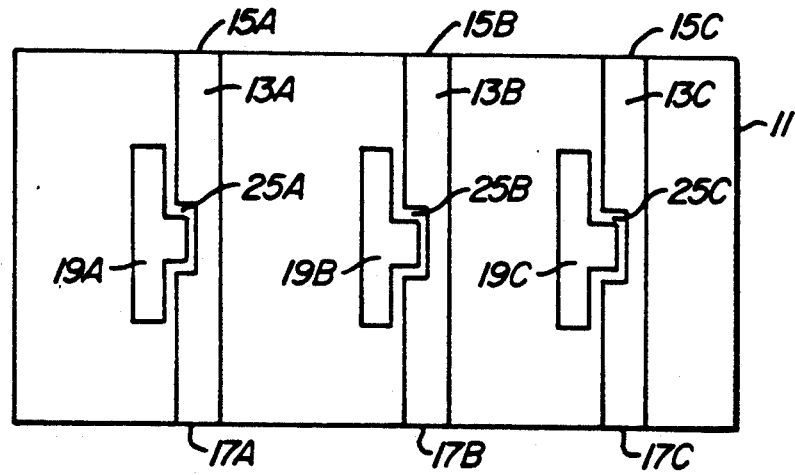
FIG. 9C is a diagram showing a top-down view of a plurality of lasers and their corresponding detectors wherein the plurality of lasers contain a square indentation and the corresponding detectors contain a square protrusion which fits within the square indentation of the plurality of lasers.

FIG. 9A is the preferred embodiment of the present invention. In this embodiment, laser cavity 13 has a perturbation 25 in the shape of a square indentation. This shape has proved to produce the best light-coupling characteristics. Detector cavity 19 has a protrusion extending into and matching the shape of perturbation 25. A derivative embodiment of FIG. 9A is shown in FIG. 9B. In this embodiment, perturbation 25 is in the shape of a gap 41 in laser cavity 13. Detector cavity 19 includes a protrusion which extends into gap 41 and receives light directly as it passes through gap 41. FIG.

9C shows a similar embodiment to that of FIG. 9A. However, it includes a plurality of laser cavities 13 and corresponding detector cavities 19.

Figure 11A:
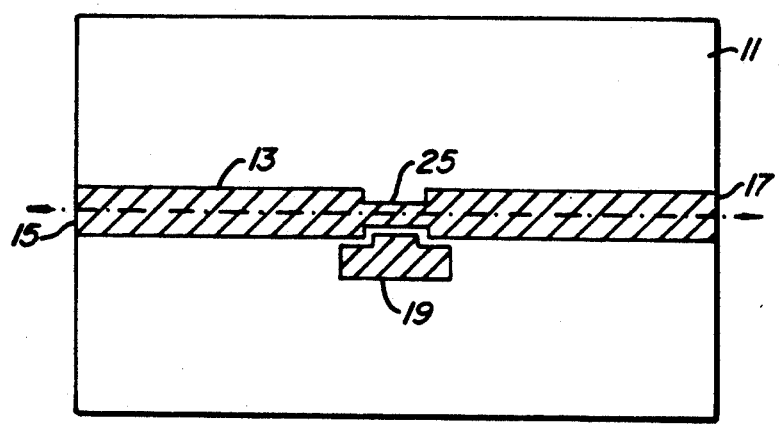
FIG. 11A is a diagram showing a top-down view of a laser and its corresponding detector on a semiconductor substrate the laser contains a narrowed section and the detector contains a squared protrusion fitting within one side of the narrowed section of the laser.
Figure 12A:
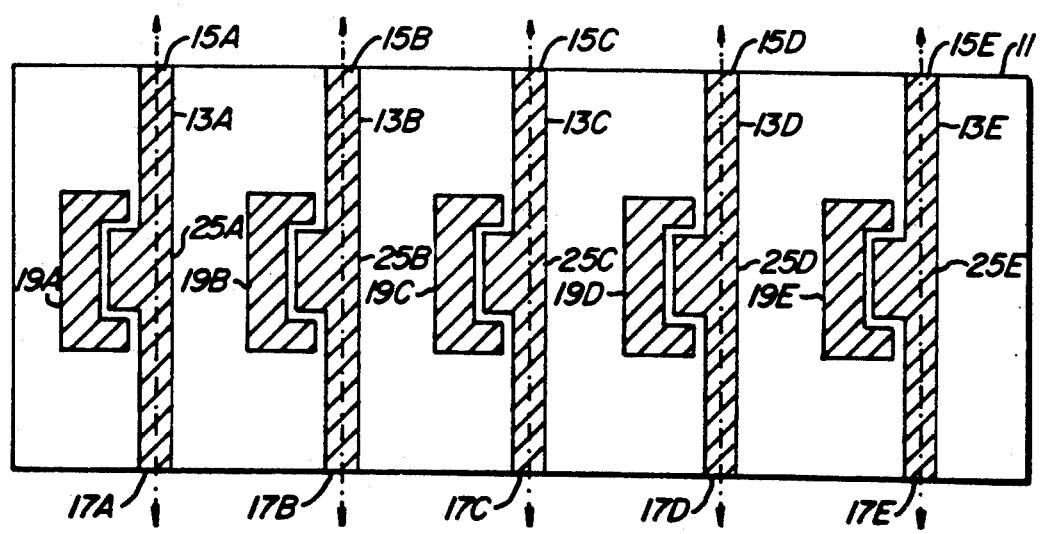
FIG. 12A is a diagram showing a top-down view of a multiplicity of lasers and their corresponding detectors on a semiconductor substrate wherein the lasers contain a square protrusion and the detectors contain a square indentation fitting around the protrusion extending from the lasers.

FIG. 11A illustrates an embodiment of the invention in which a waveguide having weaker optical confinement is introduced as the perturbation 25 in laser cavity 13. By making the composition of the active layer approach the concentration of the cladding layer, the light can be altered as it moves through perturbation 25. This enhances the light in the detector by reducing the refraction index and makes it easier to detect in detector cavity 19. Reduction in the refraction index is achieved by decreasing the concentration of aluminum in the active layer during formation. A similar effect can be achieved by narrowing the waveguide in perturbation 25. FIG. 11B illustrates an embodiment in which the detector symmetrically surrounds the narrowed waveguide.

Figure 12B:
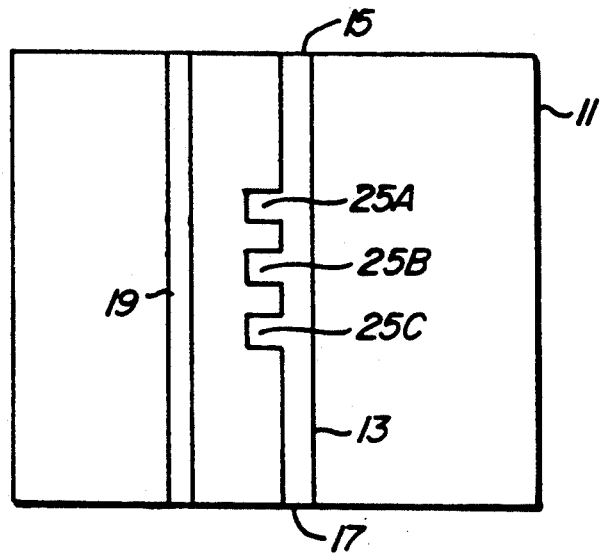
FIG. 12B is a diagram showing a top-down view of a laser and its corresponding detector on a semiconductor substrate wherein the laser contains a group of perturbations.
Figure 12C:
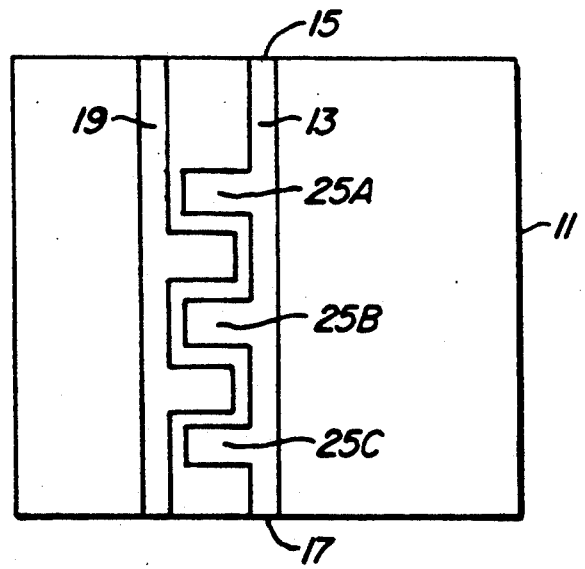
FIG. 12C is a diagram showing a top-down view of a laser and its corresponding detector on a semiconductor substrate wherein the laser contains a group of perturbations and the detector includes corresponding perturbations.

FIGS. 12B and 12C illustrate two embodiments wherein multiple perturbations 25A-25C are included in laser cavity 13. These perturbations multiply the light-scattering effect of a single perturbation. In FIG. 12B, multiple protrusions from detector cavity 19 are included to match perturbations 25A-C.

Figure 13:
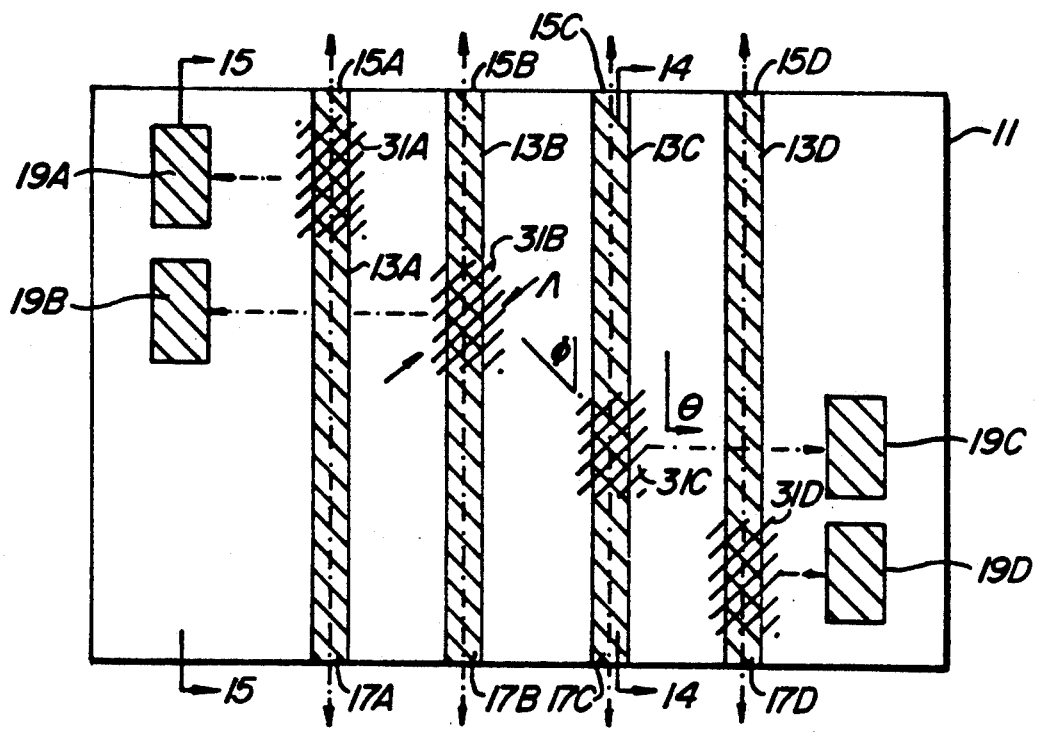
FIG. 13 is a diagram showing a top-down view of a multiplicity of lasers and their corresponding detectors on a semiconductor substrate wherein the lasers contain a corrugated section which deflects a portion of the light in the laser cavity into the corresponding detector.

FIG. 13 is a diagram showing a top-down view of semiconductor 11 having a multiplicity of laser cavities 13A-D and detector cavities 19A-D formed thereon. In this configuration, laser cavities 13A and 13 D are positioned in the center of semiconductor substrate 11 and are flanked on the sides with detector cavities 19A-D. In this particular embodiment, detector cavities 19A and 19B are shown on the left, while detector cavities 19C and 19D are shown on the right. Each laser cavity 13 contains a layer of cladding which when formed over the top of laser cavity 13 causes light to be directed laterally from laser cavity 13. Cladding 31 is positioned on each laser cavity 13 at a different point such that light can be deflected from a particular laser cavity 13 to its corresponding detector cavity 19.

The spacing (d) of the grooves 31 in the cladding is chosen to be $d = m\lambda/(2 \sin \phi)$, where $\phi$ is the angle made by the axis of the waveguide and groove, $\lambda$ is the wavelength of the lasing emission, and m is an integer referred to as the order of corrugation. For example, in the illustration in FIG. 13, assume that $\phi = 45°$ and $d = \lambda/\sqrt{2}$. This is a preferred embodiment since only one constructive reflection exists, namely $m = 1$ at $d = 45°$. If we take $\phi = 2\lambda/\sqrt{2}$, a second constructive reflection exists at $\lambda = 20.7°$. The frequency of lasing can be fixed at $\lambda$ by incorporating a distributed feedback corrugation in the body of the active layer or by incorporating a distributed Bragg reflector as one mirror of the laser cavity if necessary.

The preferred way to make the corrugation is by etching a first cladding layer and overgrowing a second cladding layer with different composition. This is a standard technique in the art.

Figure 14:
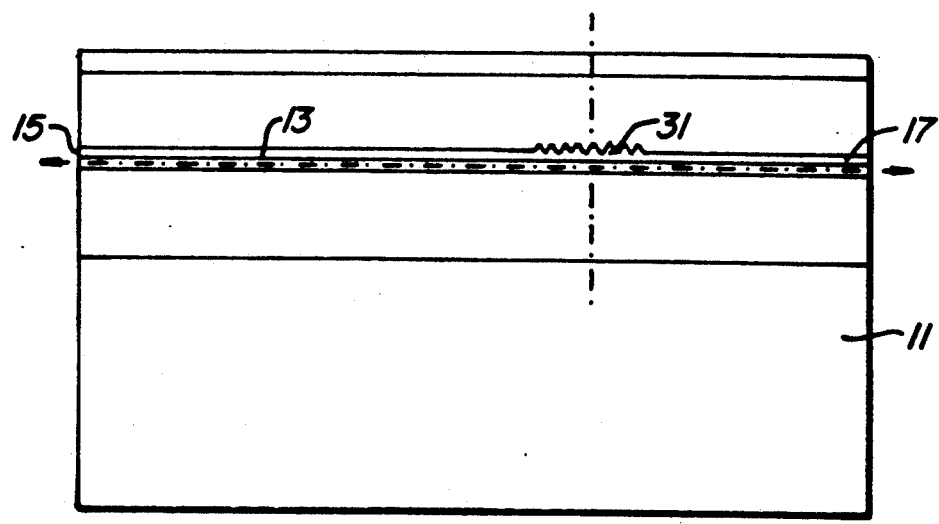
FIG. 14 is a side view taken along the 14—14 line shown in FIG. 13 of one of the laser stripes.

FIG. 14 shows a side view at the plane cut along line 14—14 of FIG. 13. As can be seen from this figure, cladding 31 is formed on top of laser cavity 13 on semiconductor substrate 11. Cladding 31 can then be shaped to produce a deflection angle of light from laser cavity 13. The ability to adjust the deflection angle of light being emitted from laser cavity 13 allows for detection cavity 19 to be placed at a desired position.

Figure 15:
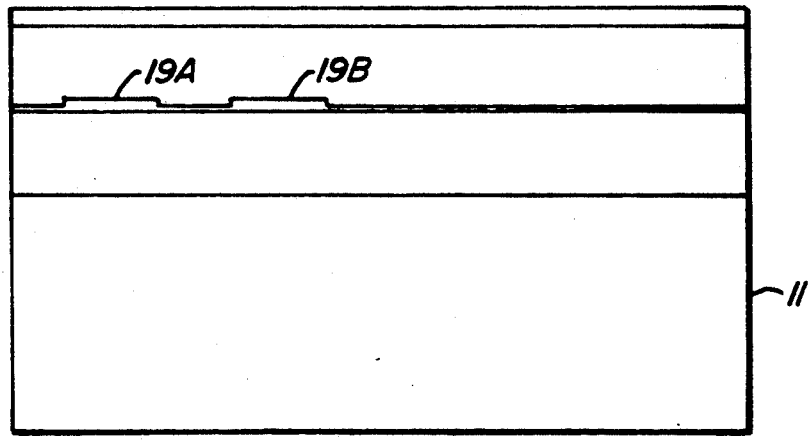
FIG. 15 is a diagram showing a side view taken along the line 15—15 of FIG. 13, showing a side view of a pair of the detectors shown in FIG. 13.

FIG. 15 is a diagram showing a side view taken along the 15—15 line of FIG. 13. The two rectangular sections shown together in a separate layer are detection cavities 19A and 19B.

Figure 16:
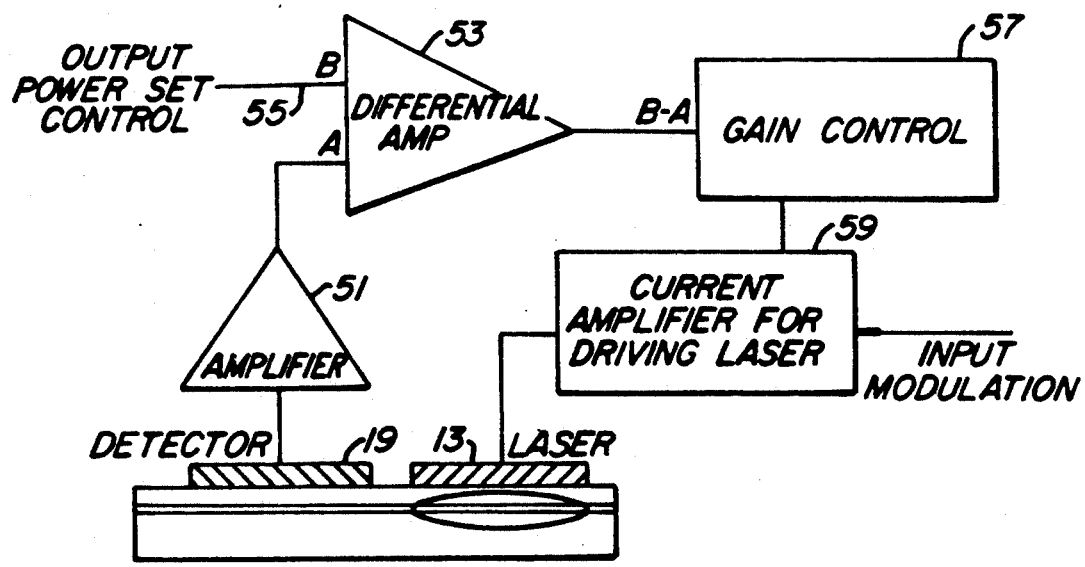
FIG. 16 is a circuit diagram of the feedback circuit connected between the laser cavity and the detector cavity for controlling the output of the laser.

FIG. 16 is a circuit diagram of the feedback circuit used to detect the output of the laser and adjust it to a desired level. Laser cavity 13 and detector cavity 19 are the same as those shown in FIGS. 1-15. An amplifier 51 amplifies the detected output level and feeds it to a differential amplifier 53. The signal is compared to a set control signal input on output power set control line 55. The difference between the two signals is input to a gain control 57. Gain control 57 sets an adjustment signal which is fed through a current amplifier 59 for driving laser 13. Input modulation line 61 is used to adjust the current level in response to the information input signal.

In general to those skilled in the art to which this invention relates, many changes in construction and widely differing embodiments and applications of the present invention will suggest themselves without departing from the spirit and the scope of the present invention. For instance, the orientation and positioning of laser cavities 13 and detection cavities 19 may assume various configurations. Further, the shape and length of perturbation 25 and detection cavity 19 may assume an unlimited number of permutations. Further, the spacing of laser cavity 13 from detection cavity 19 is not fixed to one measurement. Therefore, the disclosures and descriptions herein are purely illustrative and are not intended to be in any sense limiting. The scope of the invention is set forth in the appended claims.

What is claimed is:

1. An apparatus for providing a laser and detecting the output of the laser, comprising:
   a monolithic semiconductor substrate having a plurality of semiconductor heterostructure layers disposed over a substrate;
   at least one first active region formed in a first named layer or layers on said semiconductor substrate, said at least one first active region being capable of light amplification and propagation under lasing conditions, biased to provide a laser wherein light propagates along a first path, said first path including a main segment having first and second substantially parallel opposite sides and a perturbation segment, where the distance between the sides of said perturbation segment is different from the distance between the sides of said main segment; and
   at least one second active region formed in said first layer on said semiconductor substrate substantially close to said at least one first active region, said at least one second active region being biased to detect an amount of light emanating laterally from said at least one first active region.

2. The apparatus of claim 1 wherein said first active region emanates light from a front and a back facet.

3. The apparatus of claim 1 further comprising control means for receiving a detection signal from one of said at least one second active region representing said amount of light and in response to receiving said detection signal providing a power output signal to one of said at least one first active region representing a laser output level desired by a user.

4. The apparatus of claim 1 wherein said at least one first and second active regions are spaced at a distance of less than 2 micrometers inclusive.

5. The apparatus of claim 1 wherein said at least one first and second active regions are formed on said semiconductor substrate using a layer disordering technique.

6. The apparatus of claim 1 wherein said at least one first and second active regions are formed on said semiconductor substrate using an impurity induced layer disordering technique.

7. The apparatus of claim 1 wherein said at least one first and second active regions are formed simultaneously on said semiconductor substrate.

8. The apparatus of claim 1 wherein said perturbation segment is in the form of a geometric shape and said at least one second active region has a shape complementary to said perturbation segment.

9. The apparatus of claim 8 wherein said at least one second active region is aligned with said perturbation segment.

10. The apparatus of claim 1 wherein said at least one second active region overlaps said at least one first active region.

11. The apparatus of claim 10 wherein said at least one second active region is "H"-shaped.

12. The apparatus of claim 1 wherein there is a gap between said main segment and said perturbation segment in said at least one first active region.

13. An apparatus for providing a laser and detecting the output power of the laser, comprising:
a monolithic semiconductor substrate having a plurality of semiconductor heterostructure layers disposed over a substrate;
at least one first active region formed in a first named layer or layers on said semiconductor substrate, said at least one first active region being capable of light amplification and propagation under lasing conditions, biased to provide a laser wherein light propagates along a first path, said first path including a main segment having first and second substantially parallel opposite sides, and a perturbation segment where the distance between the sides of said perturbation segment is different from the distance between the sides of said main segment; and
at least one second active region formed in said first layer on said semiconductor substrate substantially close to said at least one first active region, said at least one second active region being biased to detect an amount of light scattered from said perturbation segment reaching said at least one second active region.

14. The apparatus of claim 13 wherein said first active region emanates light from a front and a back facet.

15. The apparatus of claim 13 wherein said perturbation segment is formed such that light reaching said perturbation segment is scattered from said at least one first active region and passes into said at least one second active region.

16. The apparatus of claim 13 further comprising control means for receiving a detection signal from one of said at least one second active region representing said amount of light and in response to receiving said detection signal providing a power output signal to one of said at least one first active region representing a laser output level desired by a user.

17. The apparatus of claim 13 wherein said at least one first and second active regions are spaced at a distance of less than 2 micrometers inclusive.

18. The apparatus of claim 13 wherein said at least one first and second active regions are formed on said semiconductor substrate using a layer disordering technique.

19. The apparatus of claim 13 wherein said at least one first and second active regions are formed on said semiconductor substrate using an impurity induced layer disordering technique.

20. The apparatus of claim 13 wherein said at least one first and second active regions are formed simultaneously on said semiconductor substrate.

21. The apparatus of claim 13 wherein said perturbation segment is in the form of a geometric shape and said at least one second active region has a shape complementary to said perturbation segment.

22. The apparatus of claim 21 wherein said at least one second active region includes a protrusion aligned with said perturbation segment.

23. The apparatus of claim 21 wherein said at least one second active region includes an indentation, said indentation being aligned with said perturbation segment.

24. The apparatus of claim 13 wherein there is a gap between said main segment and said perturbation segment in said at least one first active region.

25. The apparatus of claim 13 wherein said first path includes a plurality of perturbation segments in said at least one first active region, said perturbation segments including a protrusion.

26. The apparatus of claim 13 wherein said first path includes a plurality of perturbation segments in said at least one first active region, said perturbation segments including an indentation.

27. The apparatus of claim 21 wherein said at least one second active region includes a plurality of protrusions.

28. The apparatus of claim 21 wherein said at least one second active region includes a plurality of indentations.

29. The apparatus of claim 13 wherein said perturbation segment includes a protrusion.

30. The apparatus of claim 20 wherein said perturbation segment includes an indentation.

31. An apparatus for providing a laser and detecting the output power of the laser, comprising:
a monolithic semiconductor substrate having a plurality of semiconductor heterostructure layers disposed over a substrate;
at least one first active region formed in a first layer or layers on said semiconductor substrate, said first active region being capable of light amplification and propagation under lasing conditions, said first active region including a waveguide having an optical confinement, said first active region biased to provide a laser wherein light propagates along a first path, said first path including a first section comprising a waveguide having a weaker optical confinement than said at least one first active region; and
at least one second active region formed on said semiconductor substrate substantially close to said at least one first active region, said at least one second active region being biased to detect an amount of light emanating from said waveguide having weaker optical confinement.

32. The apparatus of claim 31 wherein said first active region emanates light from a front and a back facet.

33. The apparatus of claim 31 further comprising control means for receiving a detection signal from one of said at least one second active region representing said amount of light and in response to receiving said detection signal providing a power output signal to one of said at least one first active region representing a laser output level desired by a user.

34. The apparatus of claim 31 wherein said at least one first and second active regions are formed on said semiconductor substrate using a layer disordering technique.

35. The apparatus of claim 31 wherein said at least one first and second active regions are formed on said semiconductor substrate using an impurity induced layer disordering technique.

36. The apparatus of claim 31 wherein said at least one first and second active regions are formed simultaneously on said semiconductor substrate.

37. The apparatus of claim 31 wherein said section is in the form of a geometric shape and said at least one second active region has a shape complementary to said section.

38. An apparatus for providing a laser and detecting the output power of the laser, comprising:
a monolithic semiconductor substrate having a plurality of semiconductor heterostructure layers disposed over a substrate;
at least one first active region formed in a first named layer or layers on said semiconductor substrate, said at least one first active region being capable of light amplification and propagation under lasing conditions, biased to provide a laser wherein light propagates along a first path, said first path including a perturbation comprising deflection means positioned to deflect at least a portion of light from said first path; and
at least one second active region formed on said semiconductor substrate substantially close to said at least one first active region, said at least one second active region being biased to detect an amount of light deflected from said first path.

39. The apparatus of claim 38 wherein said first active region emanates light from a front and a back facet.

40. The apparatus of claim 38 further comprising control means for receiving a detection signal from one of said at least one second active region representing said amount of light and in response to receiving said detection signal providing a power output signal to said at least one first active region representing a laser output level desired by a user.

41. The apparatus of claim 38 wherein said deflection means is a grating having a period such that constructive reflection of light is produced from said at least one first active region to said at least one second active region.

42. The apparatus of claim 38 wherein said at least one first and second active regions are formed on said semiconductor using a layer disordering technique.

43. The apparatus of claim 38 wherein said at least one first and second active regions are formed on said semiconductor substrate using an impurity induced layer disordering technique.

44. The apparatus of claim 38 wherein said at least one first and second active regions are formed simultaneously on said semiconductor substrate.

45. The apparatus of claim 38 wherein said at least one second active region includes a first perturbation.

46. The apparatus of claim 38 wherein said deflection means comprises at least one angled reflector.

47. The apparatus of claim 46 wherein said at least one angled reflector is formed on said semiconductor substrate by disordering layers of said semiconductor substrate outside said at least one first and second active regions.

48. The apparatus of claim 46 wherein said at least one angled reflector is formed on said semiconductor substrate by impurity induced disordering of layers of said semiconductor substrate outside said at least one first and second active regions.

49. An apparatus for providing a laser and detecting the output power of the laser, comprising:
a monolithic semiconductor substrate having a plurality of semiconductor heterostructure layers disposed over a substrate;
at least one first active region formed in a first named layer or layers on said semiconductor substrate, said at least one first active region being capable of light amplification and propagation under lasing conditions, biased to provide a laser wherein light propagates along a first path, said first path including a main segment having first and second substantially parallel opposite sides and a perturbation segment, said perturbation segment having a first side which is not parallel to said first side of said main segment; and
at least one second active region formed in said first layer on said semiconductor substrate substantially close to said at least one first active region, said second active region being biased to detect an amount of light emanating laterally from said at least one first active region.

50. An apparatus for providing a laser and detecting the output power of the laser, comprising:
a monolithic semiconductor substrate having a plurality of semiconductor heterostructure layers disposed over a substrate;
at least one first active region formed in a first named layer or layers on said semiconductor substrate, said at least one first active region being capable of light amplification and propagation under lasing conditions, biased to provide a laser wherein light propagates along a first path, said first path including a main segment having first and second substantially parallel opposite sides, and a perturbation segment, said perturbation segment having a first side which is not parallel to said first side of said main segment; and
at least one second active region formed in said first layer on said semiconductor substrate substantially close to said at least one first active region, said at least on second active region being biased to detect an amount of light emanating laterally from said at least one first active region.

* * * * *

UNITED STATES PATENT AND TRADEMARK OFFICE
CERTIFICATE OF CORRECTION

PATENT NO. : 5,136,604

DATED : Aug. 4, 1992

INVENTOR(S) : Paoli et al.

It is certified that error appears in the above-identified patent and that said Letters Patent is hereby corrected as shown below:

On the Title page,

In item [75] of the Title page, change the inventor's name from "Doald R. Scifres" to --Donald R. Scifres--.

Signed and Sealed this

Ninth Day of November, 1993

*Attest:*

BRUCE LEHMAN

*Attesting Officer*  *Commissioner of Patents and Trademarks*